US006437622B1

United States Patent
Tinsley et al.

(10) Patent No.: US 6,437,622 B1
(45) Date of Patent: Aug. 20, 2002

(54) TEMPERATURE COMPENSATED SLEW RATE CONTROL CIRCUIT

(75) Inventors: Steven J. Tinsley, Garland; Julie Hwang, Richardson; Mark W. Morgan, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/818,111

(22) Filed: Mar. 27, 2001

(51) Int. Cl.$^7$ ............................... H03K 5/13; H02J 1/00
(52) U.S. Cl. ...................... 327/175; 327/513; 327/530
(58) Field of Search ................... 327/172, 175, 327/170, 512, 513, 530

(56) References Cited

U.S. PATENT DOCUMENTS

| | | | |
|---|---|---|---|
| 5,640,122 A | * | 6/1997 | McClure ................. 327/530 |
| 5,838,191 A | * | 11/1998 | Oris et al. .............. 327/539 |
| 5,856,753 A | * | 1/1999 | Xu et al. ................ 327/175 |

\* cited by examiner

*Primary Examiner*—Dinh T. Le
(74) *Attorney, Agent, or Firm*—W. Daniel Swayze, Jr.; W. James Brady; Frederick J. Telecky, Jr.

(57) ABSTRACT

The present invention provides improved slew rate control over a varied operating temperature range. A switching device (P1, N1) receives from a predrive circuit (56) a control signal that limits a slew rate of the switching device's output and also varies proportionally to the operating temperature. In this manner, the effect of temperature on the slew rate can be reduced.

8 Claims, 1 Drawing Sheet

TEMPERATURE COMPENSATED SLEW RATE CONTROL CIRCUIT

BACKGROUND OF THE INVENTION

1. Technical Field of the Invention

The present invention relates generally to the field of integrated circuits and, more particularly, to a system and apparatus of temperature compensated slew rate control.

2. Description of Related Art

In interface integrated circuits, it is often desirable to control the transition speed, or slew rate, of digital outputs. Greater slew rates, and the corresponding shorter transition times, cause problems due to radiated noise, substrate injection, and crosstalk effects. In many applications, it is desirable to limit the rate at which outputs change states, especially when these outputs are rail-to-rail. Unfortunately, although there is often a need to limit the maximum slew rate, there also exists a minimum slew rate which may not be violated to insure the maximum data rate. In transceiver circuits, these limitations are typically applied to the receiver outputs, since these outputs are rail-to-rail, and must switch in a specified period to maintain the maximum guaranteed switching rate of the receiver.

Generally, current slew rate control circuits provide poor slew rate tracking over a varied temperature range. The control of the slew rate dramatically deteriorates when the associated integrated circuit is operated in a low temperature—high supply voltage condition or fast-condition. In the fast-condition state, the output buffer current capability increases and the logic gate propagation delay decreases. In a high temperature—low supply voltage or slow-condition, the associated increase in logic gate propagation delay causes an unacceptable increase in the switching times of the output buffers.

As with most design problems in semiconductor design, there are many ways to attempt to control slew rate for a rail-to-rail output. The chief objectives of slew rate control are to control the transition time of an output between a minimum and maximum rise/fall time specification. Generally it is desirable that the rise and fall times be evenly matched, that the output signal be reasonably free of distortion, and that the rise and fall time conditions are met over reasonably allowed conditions of temperature.

SUMMARY OF THE INVENTION

The present invention achieves technical advantages as an apparatus and system of temperature compensated slew rate control for interface type circuits. A switching device is controlled by a predrive which supplies a control signal that limits an output slew rate of the switching device and also varies proportionally to the operating temperature of the switching device.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Figure 1:
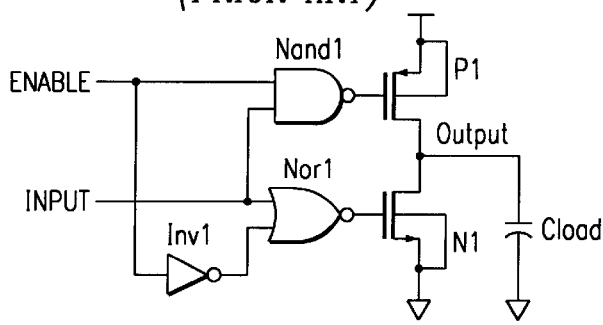
FIG. 1 (prior art) illustrates a tristate output circuit with a predrive circuit to control rise time.

For exemplary purposes of exposition, a receiver output circuit implemented as a CMOS output, will be considered. Such a CMOS output includes a PMOS transistor and an NMOS transistor, with drains connected together and sources connected to the respective supply rails. Input is applied to the gates, and is usually implemented in a tristate configuration such that the two transistors may either be switched together, or both may be turned off (PMOS input high, NMOS input low). Several methods are frequently used to control the slew rate of the output. One method simply uses the geometry of the predrive gates to control rise time. FIG. 1 shows the basic tristate output cell as used in many modem designs.

In the circuit of FIG. 1, transistors P1 and N1 are generally large driver devices, capable of driving a load (Cload). Depending on the application, a DC current drive requirement may set the size of these transistors. The slew rate of the output node is set by the current provided from Nand1 and Nor1 into the gates of P1 and N1, where these gates act like current loaded capacitors. The voltage on the gate of each transistor is the integral of the current into that gate, and follows the basic capacitive voltage relationship $$V = \frac{1}{C}\int i \cdot dt.$$

Figure 2:
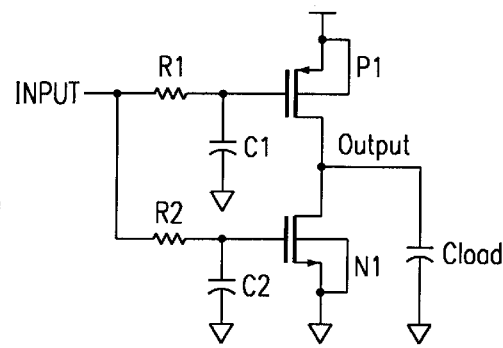
FIG. 2 (prior art) illustrates an improved RC type slew rate control to circuit and output circuit.

Another methodology adds an intentional RC component to the gates of P1 and N1, as shown in FIG. 2. In the circuit of FIG. 2, the gate voltages of P1 and N1 are further controlled by R1, R2, C1 and C2. The input to this circuit can be the same Nand/Nor type tristate circuit configuration as shown in FIG. 1.

Another technique involves splitting P1 and N1 into separate parallel transistors, and placing series resistors between each of the gates to delay turn-on of several stages.

One of the problems with many slew rate control methodologies, and the aforementioned methodologies in particular, arises from the temperature sensitivity of MOS devices in transient operation. In general, MOS transistors tend to get slower at high temperatures and faster at lower temperatures. This effect is due to the temperature sensitivity of electron and hole mobility, which in turn affects the current drive of the MOS transistors. For MOS devices, the drive current is given by the relationship $$\frac{k'}{2} \cdot \frac{W}{L} \cdot (Vgs - Vt)^2$$

where $k'=\mu_n \cdot Cox$ for NMOS transistors, and where W is the transistor gate width, L is the transistor gate length, Vgs is the gate/source voltage, Vt is the MOS threshold voltage, $\mu_n$ is the electron mobility, and Cox is the oxide capacitance. A further description of MOS drive current can be found in "Analysis and Design of Analog Integrated Circuits" Third Edition, by Paul R. Grey and Robert G. Meyer, the disclosure of which is hereby incorporated by reference. There is a power law increase in $\mu_n$ as temperature goes down. In particular, for Na or Nd (doping densities)$\leq 1E14/cm^3$, $\mu_n$ $T^{-2.3 \pm 0.1}$. A further description can be found in "Semiconductor Device Fundamentals," by Robert F. Pierret, the disclosure of which is hereby incorporated by reference. Over the industrial temperature range of −40 C. to 125 C., for example, this effect can be quite significant, as is illustrated in FIG. 3.

Figure 3:
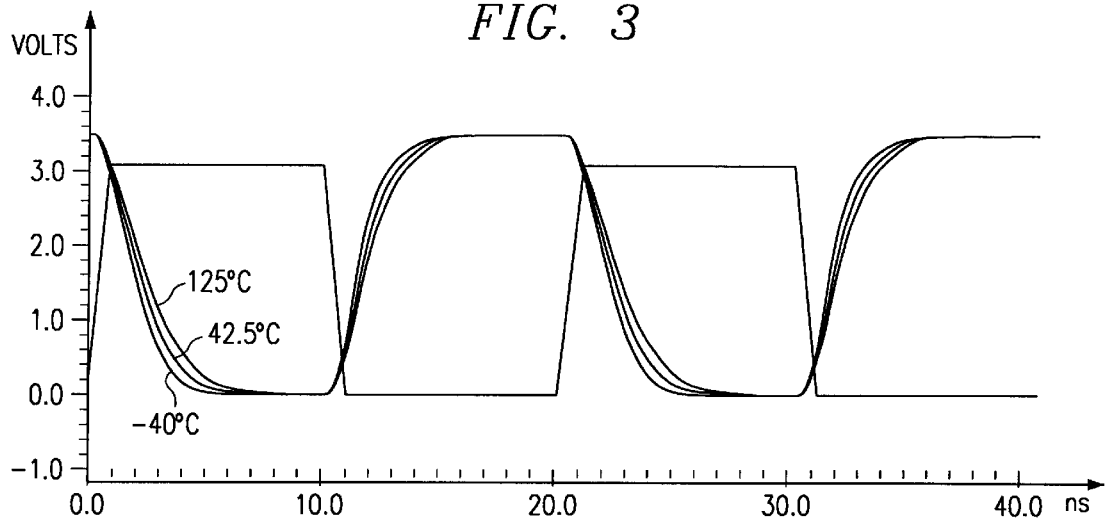
FIG. 3 shows a graph of transition time for a common MOS device over an industrial temperature range.

FIG. 3 illustrates the input and output waveforms for a simple CMOS inverter in an exemplary 0.6 u BiCmos process with a 10 pF purely capacitive load. In this example, the inverter geometries are P=90/0.6, N=30/0.6. (The k' difference between PMOS and NMOS devices due to relative mobility explains the 3×difference in sizing as is standard practice). In this illustration, the rise time varies from 2 nS to 2.8 nS over the industrial temperature range, which calculates to about a 40% variance due mostly to temperature effects. In many applications, the rise time requirements over temperature, supply voltage and process variation are tight enough that such a variation would violate device specifications. A compounding problem is that, in a system which uses the topology illustrated in FIG. 1, the devices in the NAND and NOR gates tend to become weaker at higher temperatures as well, further effecting the rise times. An aspect of the present invention is to reduce the effect of temperature on rise time of a CMOS receiver output by implementing first order temperature compensation in the predrive circuit.

Some integrated circuits use a current source that compensates for changes that occur within the circuit due to temperature. For example, analog signal processing circuits using bipolar type amplifiers typically use a biasing current source often referred to as a Current Proportional to Absolute Temperature (IPTAT) source. An IPTAT type circuit is configured to vary its current output in proportion to changes in temperature. Thus, variations in the performance of the circuit due to changes in the operating temperature can be at least partly compensated for by corresponding changes in the current supplied by the IPTAT circuit.

Figure 4:
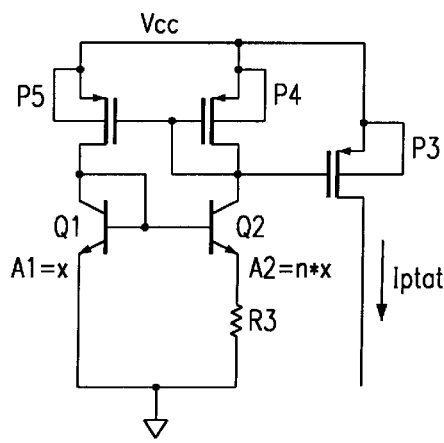
FIG. 4 illustrates an IPTAT current source in accordance with an embodiment of the present invention.

Referring now to FIG. 4 there is illustrated an example of an IPTAT type circuit in accordance with an exemplary embodiment of the present invention, including CMOS transistors P3, P4, and P5,and bipolar transistors Q1 and Q2. This circuit operates on the principle that the current in Q2 is set by the natural logarithm of the ratio of the emitter area A1 of Q1 to the emitter area A2 of Q2, and is proportional to Vt, the semiconductor thermal voltage. The formula for the current in Q2 is Iq2=Vt/R3*ln(x/n*x), where 1/n is the ratio of the area A1 of Q1 to the area A2 of Q2. Since the areas of the transistors are not temperature sensitive, the current is proportional to Vt which is kT/q, where k is Boltzman's constant, T is absolute temperature, and q is the charge of the electron. Thus, the IPTAT current source is basically independent of Vcc but is proportional to absolute temperature.

Figure 5:
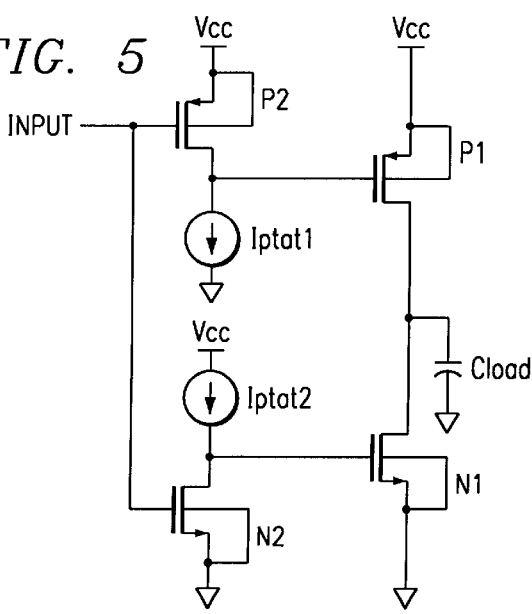
FIG. 5 illustrates a temperature compensated slew rate control circuit in accordance with a preferred embodiment of the present invention.

Referring to FIG. 5 there is illustrated a temperature compensated slew rate control circuit in accordance with an exemplary embodiment of the present invention. The output buffer includes a PMOS device (P1) and a NMOS device (N1) serially connected between a power supply line Vcc and ground. The common node of P1 and N1 provides an output signal that is coupled to a capacitive external load (Cload). The output buffer is supplied by a predrive control circuit to compensate the switching current over a temperature range. More specifically, the gate drives of P1 and N1 are controlled by PMOS transistor switch P2 and NMOS transistor switch N2, respectively. Switches P2 and N2 are respectively loaded by IPTAT current sources (IPTAT1, IPTAT2). The IPTAT current sources limit the rise and fall times by providing limited currents into the gates of the drive transistors P1 and N1. For example, regarding P1, the IPTAT current is used to pull the gate down and P2 is used to pull the gate up so that P1 turns off very quickly but turns on at a rate that is proportional to absolute temperature. IPTAT1 and IPTAT2 can be of the exemplary type shown in FIG. 4, or other type IPTAT current sources can be used.

In FIG. 5, the gate currents which turn on the transistors P1, N1 are controlled by respective IPTAT circuits, thus advantageously permitting the slew rate to be limited to a desired maximum value. The temperature compensated arrangement provides more gate turn on current at higher temperatures, and less gate turn on current at lower temperatures. The effect is a first order compensation of the V=1c∫i·dt relationship. For example, by increasing the gate di/dt at high temperatures, the gate predrive slews more quickly, and compensates for the weakened (high temperature) response of the drive transistors P1 and N1. The rise/fall time is controlled by the amount of gate current provided by the IPTAT circuits IPTAT1, IPTAT2. The IPTAT circuits compensate for temperature-induced slew rate changes of the drive transistors P1, N1 by adjusting their gate drive currents over temperature, Thus, the effect of temperature on the rise/fall time of a circuit such as a CMOS receiver output can be reduced by using the presently described temperature compensation architecture in the predrive circuit. Using the present invention can, for example, lower the rise/fall time variance of a CMOS receiver output over the industrial temperature range of −40° C. to 125° C.

Although a preferred embodiment of the apparatus and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A circuit with temperature compensated slew rate control comprising:

an output buffer comprising at least two transistor driver devices for providing an output current to a capacitive load; and a predrive control circuit coupled to said output buffer for providing an input current to said output buffer, said predrive control circuit comprising:

at least two transistor switching devices for enabling said input current to be applied to said output buffer; and a temperature compensation circuit including at least two current sources for enabling said input current to vary proportionally to temperature, said two current sources being connected to said at least two transistor switching devices.

2. The circuit of claim 1, wherein said output buffer comprises a first metal oxide semiconductor (MOS) device, and a second MOS device serially coupled with said first MOS device between a power supply line and a ground line, wherein a common node of said first and second MOS device provides said output current to said capacitive load.

3. The temperature compensated slew rate control system of claim 2, wherein said first MOS device is a PMOS device and said second MOS device is a NMOS device.

4. The circuit of claim 3, wherein said temperature compensation circuit comprises:

said first current source being a first current proportional to absolute temperature (IPTAT) circuit serially coupled to a aid third MOS device between a power supply line and a ground line; and said second current source being a second IPTAT circuit serially coupled to a fourth MOS device between said power supply line and said ground line.

5. The circuit of claim 1, wherein said transistor switching devices are coupled to said temperature compensation circuit between a power supply line and a ground line, wherein a common node of said transistor switching devices and temperature compensation circuit are coupled to said output buffer.

6. The circuit of claim 5, wherein said transistor switching devices comprise a metal oxide semiconductor (MOS) device.

7. The circuit of claim 1, wherein said temperature compensation circuit comprises a current proportional to absolute temperature circuit, and wherein said input current increases proportional to an increase in absolute temperature and decreases proportional to a decrease in absolute temperature.

8. The circuit of claim 1, wherein said predrive control circuit is operable for controlling a slew rate of a digital output signal associated with said output current over an industrial temperature range of approximately −40° C. to approximately 125° C.

* * * * *